METHOD OF MAKING A SCHOTTKY BARRIER DEVICE

Filed Sept. 29, 1969 2 Sheets-Sheet 1

M. IIZUKA, S. FUJIWARA, G. KANO, H. HASEGAWA, I. TERAMOTO & H. IWASA INVENTORS

BY Stevens, Davis, Miller & Mosher ATTORNEY

METHOD OF MAKING A SCHOTTKY BARRIER DEVICE

Filed Sept. 29, 1969 2 Sheets-Sheet 2

United States Patent Office 3,752,702
Patented Aug. 14, 1973

3,752,702
METHOD OF MAKING A SCHOTTKY BARRIER DEVICE

Mutsuo Iizuka, 801 Oaza Hoshida, Katanocho, Kitakawa-chi-gun, Osaka, Japan; Shohei Fujiwara, 6–23 Himurocho-1-chome, Takatsuki-shi, Japan; Gota Kano, 38 Uguisudai, Nagaokacho, Otokuni-gun, Kyoto, Japan; Hiromasa Hasegawa, 2–8 Saiwaicho, Takatsuki-shi, Japan; Iwao Teramoto, 78–83 Shimohozumi, Ibaragi-shi, Japan; and Hitoo Iwasa, 76–32 Okamotocho, Takatsuki-shi, Japan Filed Sept. 29, 1969, Ser. No. 861,670
Claims priority, application Japan, Oct. 4, 1968, 43/72,668
Int. Cl. B28d *5/00*; H01l *7/50*
U.S. Cl. 117—217 4 Claims

ABSTRACT OF THE DISCLOSURE

An etching process for <111> oriented silicon substrate along a hexagonal window, in which an etched recess is formed along the window in a clear shape by means of directing one side of the hexagonal window parallel to a crystallographic axis <$\bar{1}$10> or <1$\bar{1}$0>. A metal is then formed in the etched recess to form the Schottky barrier between the metal and the semiconductor material by depositing said metal by means of the sputtering or vacuum evaporation method. A vacant space is thereby formed just under an insulating film along the periphery of the window, resulting in a Schottky barrier device having a good backward characteristic.

This invention relates to a method of manufacturing a semiconductor device, and more particularly to a method of manufacturing a device which utilizes the rectifying barrier formed by the contact between a semiconductor and a metal, that is a semiconductor device of the Schottky barrier type.

Figure 8:
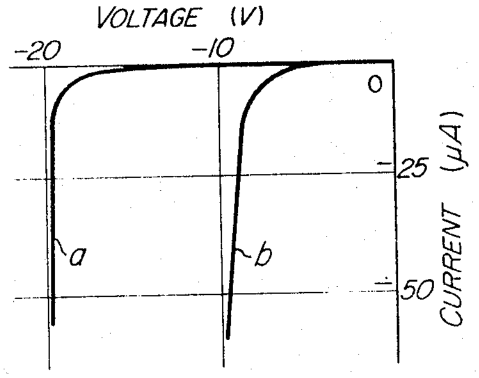

FIGS. *4a, 4b, 5a, 5b, 6a, 6b, 7a, 7b* and *7c* are views for illustrating the manufacturing method of the present invention; and FIG. 8 is a characteristic diagram illustrating the effectiveness of the present invention.

Figure 1:
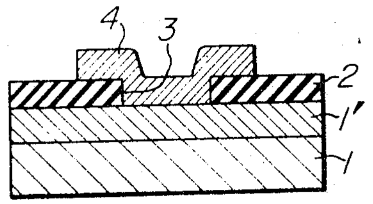
FIG. 1 PRIOR ART
FIG. 1 is a sectional view showing an example of a conventional Schottky barrier type semiconductor device.

Fig. 1 shows a Schottky barrier type semiconductor device of conventional type. This diode has a so-called planar structure in which, after forming an insulating film 2, such as a silicon oxide film, on the surface of a silicon substrate 1 having an n-type epitaxial growth layer 1' on its surface portion, a window 3 is made in the oxide film, then a predetermined metal film 4, such as molybdenum film, is applied to window 3.

However, a device having this structure has a disadvantage in that the backward breakdown voltage of the rectifying junction is lower than the expected value. That is, when a diode is constructed as a device having the above structure using a silicon substrate with an epitaxial growth layer 1' having a resistivity of 0.5Ω-cm. and a thickness of 1$\mu$ and applying a molybdenum film 4, about 20 volts are predicted as the theoretical breakdown voltage, but the breakdown voltage of the actually obtained device has such a low value as about 5–10 volts.

Figure 2:
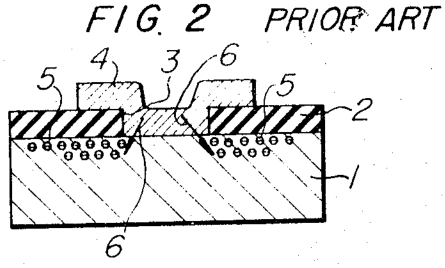
FIG. 2 PRIOR ART
FIG. 2 is a view illustrating the principle of the device shown in FIG. 1.

The reasons for this lowering of the backward breakdown voltage is considered to be that, as is illustrated in FIG. 2, with the result of the phenomenon of accumulating an electric charge 5 at the surface portion of the silicon substrate under the silicon oxide film 2, a leakage current is produced from the metal electrode 2 to said electric charge accumulating portion 5 in the direction indicated by an arrow 6 thus the backward breakdown voltage is lowered.

Though it has been proposed to provide a diffused region called a guard-ring for isolating the charged layer on the substrate encircling the junction portion of said metal and semiconductor in order to lower this leakage current, the process for manufacturing this device becomes complex and therefore is not of practical use.

Figure 3:
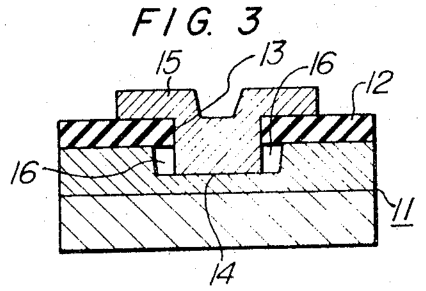
FIG. 3 is a sectional view of an embodiment of a semiconductor device manufactured by the manufacturing method of the present invention.

The inventors of the present invention have proposed a Schottky barrier type semiconductor device having such a novel structure as shown in FIG. 3. That is, as described with reference to FIG. 3, after forming an insulating film 12 on a semiconductor substrate 11, a window 13 is perforated to the insulating film 12 by means of a known photo-etching method. After that, the exposed semiconductor surface is etched by a chemical solution through the window 13. In the process of this chemical etching, the said semiconductor body is etched not only in the axial direction of said window 13, but also in its circumferential direction. Then a recess 14 having a dimension slightly larger than said window is formed at the surface portion of the semiconductor body under the periphery of the window 13 in said insulating film 12. In this state, a metal such as molybdenum 15 which forms a rectifying barrier in contact with the semiconductor substrate is evaporated from the axial direction of the window 13 to form a junction at the flat portion of the recess 14 in said semiconductor body. The semiconductor device having the construction thus formed is characterized by having a vacant space 16 which is formed with the result that the semiconductor under the periphery of the window 13 in said insulating film 12 is eliminated by this etching process. According to the experience of the inventors, the backward breakdown characteristic is thus improved when the recess 14 in the semiconductor body has a depth in the axial direction of the window 13 of more than 500 A. and a distance of more than 1000 A. in the direction perpendicular to said axial direction from the periphery of the window 13. It is effective for improving the stability of the semiconductor device to make the thickness of the metal film 15 thicker than the depth of recess 14, and to form the electrode by covering the window portion in the insulating film with the metal film.

The present invention is directed to a method of manufacturing a semiconductor device having the structure as shown in FIG. 3.

Though it is desirable to select such an etching solution such that the etching rate in the direction perpendicular to the sliced surface is lower than that in the other direction, especially in the lateral direction, it is very difficult to form uniformly the vacant space 16 shown in FIG. 3 since an etching solution has generally a different etching rate depending upon the direction of each crystallographic surface, even in the lateral direction.

In view of this, the object of the present invention is to provide the vacant space shown in FIG. 3 uniformly all around the periphery of the junction with good reproducibility and controllability by determining the shape of the junction window and the direction of fitting a mask, taking into account the dependency of the etching rate upon the crystallographic surface.

When a semiconductor body is etched, it is well known that the etching rate largely depends not only upon the kind of etching solution used, but also the crystallographic surface.

For example, an etching solution consisting of 8 ml. of water, 17 ml. of ethylendiamine and 3 g. of pyrocatechol has an etching rate ratio of 3:30:50 in the direction of crystallographic surface (111), (110) and (100) respectively for Si, the dependence of the etching rate upon the crystallographic surface being known to be very large.

Here, we used an etching solution having a relatively large dependence of etching rate upon the crystallographic surface and a silicon slice of which the crystallographic axis is in the direction $\langle 111 \rangle$, the etching rate being generally lower in that direction, in order to form the vacant space 16 shown in FIG. 3 in such a way as described above that the depth is relatively shallow and is uniform all around the periphery of the junction window.

Figures 4A, 4B, 5A, 5B, 6A, 6B, 7A, 7B, 7C:
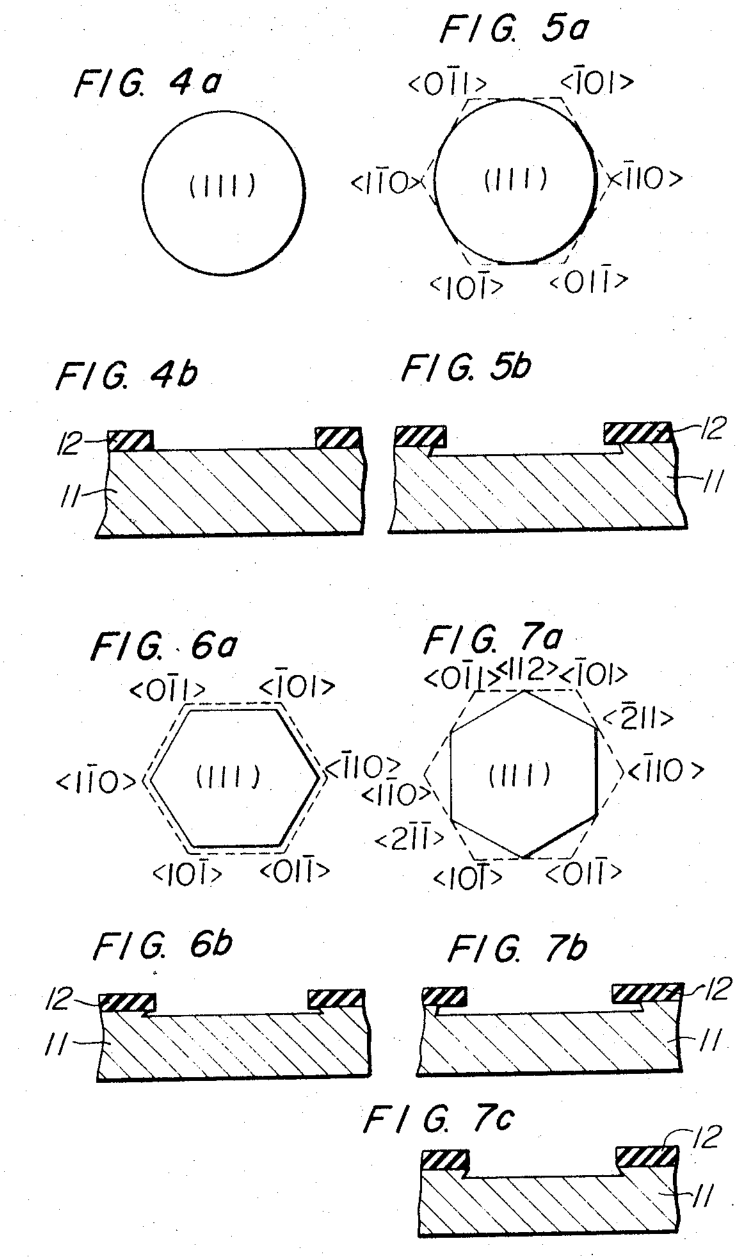

For example, as in the prior art, when an oxide film of about 5000 A. thick is formed on a silicon slice of which the crystallographic axis is in the direction $\langle 111 \rangle$, a circular window as shown in FIG. 4 is opened by the photo-etching method and the silicon surface is etched by said etching solution (water 8 ml., ethylendiamine 17 ml. and pyrocatechol 3 g.); as a result the etched recess has the shape of nearly a regular hexagon as shown in FIG. 5.

Paying attention to this directional dependence, when a window is opened in the same direction of the regular hexagon as shown in FIG. 5 with respect to the crystallographically hexagonal pattern and the silicon is etched similarly, it is found that silicon is etched in a shape as shown in FIG. 6. Similarly, when the hexagonal window is shifted by 30° with respect to the above-mentioned pattern, silicon is etched as shown by a dotted hexagon in FIG. 7.

It can be seen from FIG. 6 that the etching can be uniformly carried out in the lateral direction all around the junction window to the silicon of which the crystallographic axis is in the direction $\langle 111 \rangle$ by adjusting the direction of one side of a triangular or a hexagonal window in parallel with the direction $\langle 1\bar{1}0 \rangle$ or $\langle \bar{1}10 \rangle$.

On the other hand, in case the shape of the window or the directional dependence of the etching rate is not taken into account, some laterally over-etched portions are partly formed in providing the minimum effective vacant space all around the window, since the etching proceeds non-uniformly in the lateral direction, as undesirable examples shown in FIG. 7, so that the mechanically protective strength of the oxide film forming the vacant space becomes a problem and there is a defect in that the vacant space is broken in the manufacturing process of the diode.

As has been described above, since the vacant space 16 can be formed uniformly and effectively by determining the shape of the window and the direction of it, the reproducibility of the current to voltage characteristic and the controllability of the uniformity are substantially improved, permitting elimination of the leakage current even where the depth of the recess is relatively shallow (1000–2000 A.) compared with the conventional method. Thus the non-uniformity electrical characteristics of the diode, which is often caused by the over-digging of the recess, could have been made very small.

Now, an embodiment of the present invention will be described below.

After forming an oxide film of 5000 A. thickness on a silicon substrate which is prepared by epitaxially growing an n-type resistive layer having a high resistivity of about 0.5Ω cm. on a silicon body having an n-type high impurity concentration (more than $10^{19}/cm.^3$) and the crystallographic axis of in the direction $\langle 111 \rangle$, therefore a regular hexagonal window one side of which is 15μ in length was opened in the oxide film by the photo-etching technique in such way that one side of it becomes parallel with the direction of the crystallographic axis $\langle \bar{1}10 \rangle$ or $\langle 1\bar{1}0 \rangle$. Then, the portion of the silicon substrate exposed through said window was etched to a thickness of about 1000 A. in the direction of depth by means of an etching solution having a relative low etching rate in that direction $\langle 111 \rangle$. In this process, the etching depth in a lateral direction from the peripheral edge of said window in the insulating film, that is, the side etched length or lateral width was about 2000 A. In the next after evaporating molybdenum in a thickness of about 3000 A. through said window a gold film was evaporated on the molybdenum in a thickness of about 5000 A., and then a regular hexagonal electrode with one side of 50μ was formed centering around said window portion. Additionally, an ohmic contact was formed on the back surface of the silicon substrate by evaporating gold including 1% of antimony to which an external electrode wire was connected. Thus, a Schottky barrier type diode comprising a molybdenum-silicon junction was formed.

The backward voltage to current characteristic of the diode according to this embodiment is shown in FIG. 8, where the curve *a* represents the characteristic of a Schottky barrier type diode of the present invention which has a window in a regular hexagonal pattern the direction of which is set as described above according to the embodiment of the present invention; and *b* represents the characteristic of a Schottky barrier type diode with the same structure having a circular window. As can be seen from the figure, the backward breakdown voltage of the device according to the present invention is high and its non-uniformity is very small compared with a device prepared according to conventional methods.

As has been described above, the semiconductor device manufactured by means of the method of the present invention has a good reproducibility and controllability in that the leakage current at the junction edge portion was eliminated, and the yield rate was substantially increased.

The guard space of the present invention can be manufactured by the chemical etching technique, the manufacturing method is easy and the price is low. Moreover, the adjustment of the direction of the pattern can be made easily by forming an etched pit at a portion of the backward surface or slice surface, or a slice of which the direction is indicated by a cut can be also utilized.

What is claimed is:

1. A method of making a semiconductor device having therein a Schottky barrier junction formed in a polygonal recess on a principal surface of a semiconductor single-crystal substrate comprising the steps of:

forming, in an insulating mask applied on the $\langle 111 \rangle$ crystallographic surface of the semiconductor substrate, a polygonal window the sides of which are directed in parallel relationship with the $\langle \bar{1}01 \rangle$, $\langle 1\bar{1}0 \rangle$ and $\langle 0\bar{1}1 \rangle$ crystallographic axes of said semiconductor substrate;

etching the surface of said substrate through said polygonal window to form a side-etched recess having an undercut surrounding said recess, said undercut being formed by side etching, disposed beneath the overlap of the mask of the window in the insulating mask and having a substantially uniform lateral depth on all sides around the recess; and vapor depositing a predetermined metal on a bottom surface of said recess to form the Schottky barrier junction, said undercut remaining as a vacant insulating space which is defined by the bottom wall, by a side wall of the semiconductor substrate, by a side wall of the vapor-deposited metal and by the overlap of the insulating mask.

2. The method according to claim 1, in which said semiconductor is silicon.

3. The method according to claim 1, in which said polygonal window is of hexagonal shape.

4. The method according to claim 1, in which an aqueous solution including ethylendiamine and pyrocatechol is used in the etching step.

References Cited

UNITED STATES PATENTS

| | | | |
|---|---|---|---|
| 3,576,630 | 4/1971 | Yanagawa | 96—36 |
| 3,585,469 | 6/1971 | Jager et al. | 317—234 |
| 2,951,191 | 8/1960 | Herzog | 317—235 |

OTHER REFERENCES

Electrochemical Society Abstracts, vol. 13, No. 1, May 3, 1964 (pp. 203, 204).

Water-Amine Complexing Agent System for Etching Si, Finne et al., J. Electrochemical Soc. Solid State Science, September 1967, pp. 965–70.

Ethylene Diamine Catechol-Water Mixture Shows Preferential Etching of p–n Junction, Greenwood, J. Elechem. Soc. Electrochemical Technology, pp. 1325–6, September 1969.

IBM Technical Disclosure Bulletin, Schottky Barrier Diode by Stiks et al., p. 20, vol. 11, No. 1, June 1968.

Silicon Schottky Barrier Diode With Near-Ideal I-V Characteristics, Lepselter et al., Oct. 19, 1967. In the Bell System Technical Journal, February 1968, pp. 195–208.

JACOB H. STEINBERG, Primary Examiner

U.S. Cl. X.R.

156—17; 317—235 UA, 235 AJ, 235 AS; 117—212; 96—36